United States Patent
Liu et al.

(10) Patent No.: US 10,802,282 B2
(45) Date of Patent: Oct. 13, 2020

(54) CONTROLLING LIGHT SOURCE INTENSITIES ON OPTICALLY TRACKABLE OBJECT

(71) Applicant: Microsoft Technology Licensing, LLC, Redmond, WA (US)

(72) Inventors: Ping Liu, Issaquah, WA (US); Steven James Velat, Kirkland, WA (US); Erik Alan Holverson, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/231,205

(22) Filed: Dec. 21, 2018

(65) Prior Publication Data

US 2020/0201045 A1    Jun. 25, 2020

(51) Int. Cl.
*G02B 27/01* (2006.01)
*G06F 9/30* (2018.01)
(Continued)

(52) U.S. Cl.
CPC ......... *G02B 27/0172* (2013.01); *G06F 3/017* (2013.01); *G06F 9/30003* (2013.01);
(Continued)

(58) Field of Classification Search
CPC .... A63F 13/211; A63F 13/212; A63F 13/213; A63F 13/22; A63F 13/235; A63F 13/24; A63F 13/25; A63F 13/31; A63F 13/42; A63F 13/428; A63F 13/5255; A63F 13/53; A63F 13/80; A63F 13/92; A63F 2300/8082; F21V 23/0471; G01B 11/002; G01C 19/5776; G01D 5/26; G01J 1/44;
(Continued)

(56) References Cited

U.S. PATENT DOCUMENTS 9,092,671 B2   7/2015   Noda et al.
9,498,125 B2   11/2016  Caraffi et al.
(Continued)

FOREIGN PATENT DOCUMENTS

WO   2018208462 A1   11/2018

OTHER PUBLICATIONS

"International Search Report and Written Opinion issued in PCT Application No. PCT/US2019/65826", dated Mar. 11, 2020, 28 Pages.

*Primary Examiner* — Nelson M Rosario
(74) *Attorney, Agent, or Firm* — Alleman Hall Creasman & Tuttle LLP

(57) ABSTRACT

Examples are disclosed that relate to dynamically controlling light sources on an optically trackable peripheral device. One disclosed example provides a near-eye display device comprising an image sensor, a communications subsystem, a logic subsystem, and a storage subsystem. The storage subsystem stores instructions executable by the logic subsystem to control a peripheral device comprising a plurality of light sources by receiving image data from the image sensor, identifying in the image data a constellation of light sources formed by a subset of light sources of the peripheral device, and based upon the constellation of light sources identified, send to the peripheral device via the communications subsystem constellation information related to the constellation of light sources identified.

17 Claims, 12 Drawing Sheets

(51) Int. Cl.
*G06F 3/01* (2006.01)
*H04N 5/225* (2006.01)
*H03K 19/14* (2006.01)

(52) U.S. Cl.
CPC ........... *H03K 19/14* (2013.01); *H04N 5/2253* (2013.01); *H04N 5/2256* (2013.01)

(58) Field of Classification Search
CPC .. H04N 13/239; H04N 13/246; H04N 13/254; H04N 13/204; H05B 45/10; H05B 47/105; H05B 47/11; H05B 47/19; G02B 2027/0138; G02B 2027/014; G02B 2027/0187; G02B 27/017; G02B 27/0172; G06F 2203/0382; G06F 3/011; G06F 3/012; G06F 3/017; G06F 3/0308; G06F 3/0325; G06F 3/033; G06F 3/0346; G06F 3/038; G06F 3/04815; G06T 2207/10021; G06T 2207/10152; G06T 2207/20076; G06T 2207/30244; G06T 7/70; G06T 7/248; G06T 7/285; G06T 7/73; G06T 7/74; G06T 7/80; G06T 7/85
See application file for complete search history.

(56) References Cited

U.S. PATENT DOCUMENTS

| | | | |
|---|---|---|---|
| 9,739,458 | B2 | 8/2017 | Miyachi et al. |
| 9,779,540 | B2 | 10/2017 | Katz et al. |
| 9,898,091 | B2* | 2/2018 | Bristol .................... A63F 13/24 |
| 2010/0304868 | A1* | 12/2010 | Zalewski ................ A63F 13/42 463/38 |
| 2016/0131761 | A1 | 5/2016 | Yates et al. |
| 2016/0133201 | A1 | 5/2016 | Border et al. |
| 2016/0239092 | A1* | 8/2016 | Junuzovic ................ G02B 6/04 |
| 2016/0364910 | A1 | 12/2016 | Higgins et al. |
| 2017/0032529 | A1 | 2/2017 | De villiers et al. |
| 2017/0285344 | A1 | 10/2017 | Benko et al. |
| 2018/0074329 | A1 | 3/2018 | Kazansky et al. |
| 2018/0124387 | A1 | 5/2018 | Zhao et al. |
| 2018/0157315 | A1 | 6/2018 | Ehsan et al. |
| 2018/0329484 | A1 | 11/2018 | Steedly et al. |

\* cited by examiner

| Index Light Source | Light Source Constellation Table | | | |
|---|---|---|---|---|
| 1 | L(1),B(1) | L(11),B(11) | L(12),B(12) | ... |
| 2 | L(2),B(2) | L(21),B(21) | L(22),B(22) | ... |
| 3 | L(3),B(3) | L(31),B(31) | L(32),B(32) | ... |
| 4 | L(4),B(4) | L(41),B(41) | L(42),B(42) | ... |
| 5 | L(5),B(5) | L(51),B(51) | L(52),B(52) | ... |
| 6 | L(6),B(6) | L(61),B(61) | L(62),B(62) | ... |
| 7 | L(7),B(7) | L(71),B(71) | L(72),B(72) | ... |
| 8 | L(8),B(8) | L(81),B(81) | L(82),B(82) | ... |
| ... | ... | ... | ... | L(IJ),B(IJ) |
| n | L(n),B(n) | L(n1),B(n1) | L(n2),B(n2) | ... |

FIG. 3

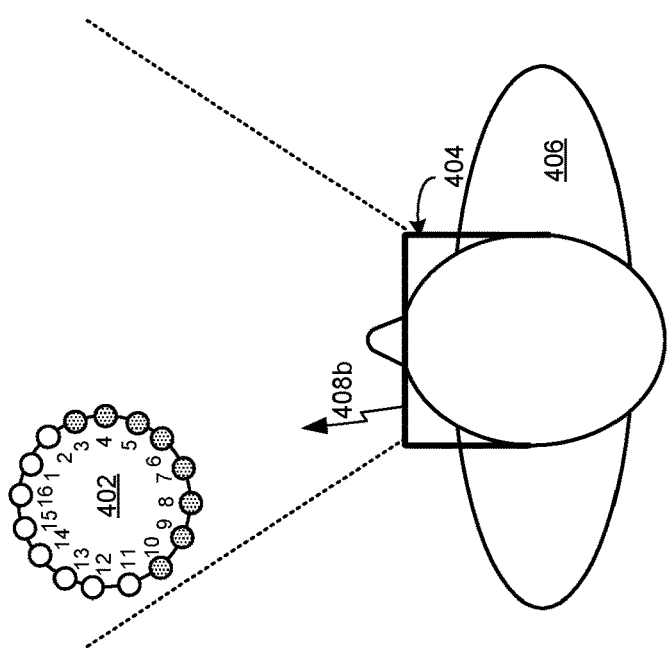
FIG. 4B
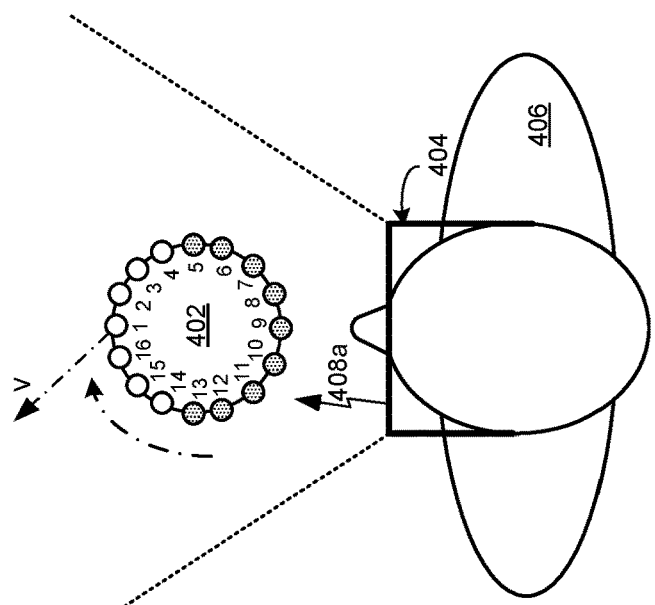
FIG. 4A
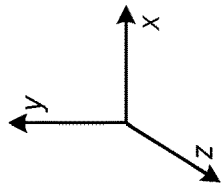

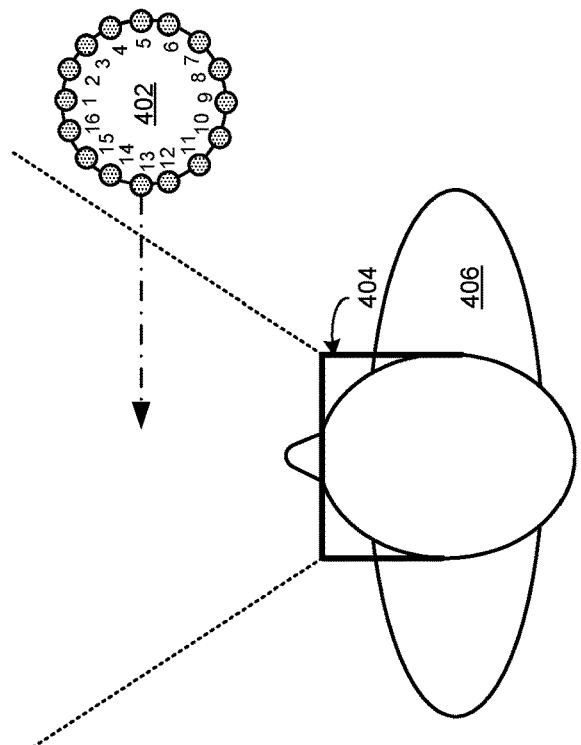
FIG. 6B
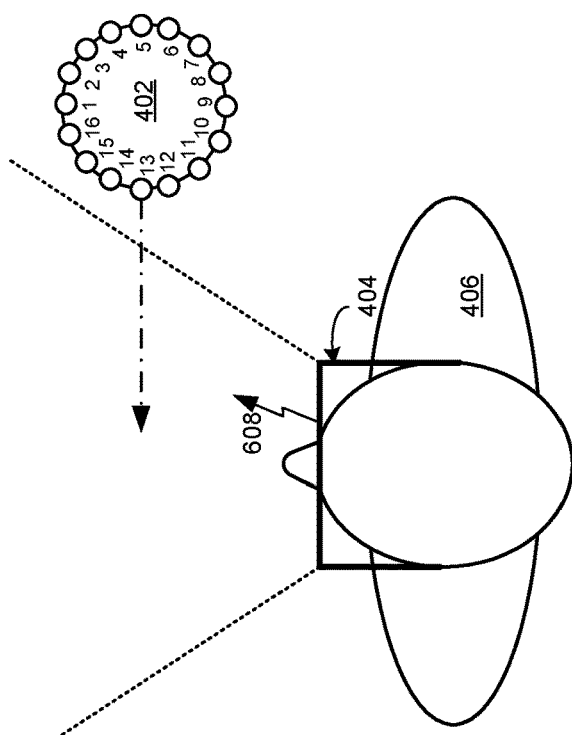
FIG. 6A
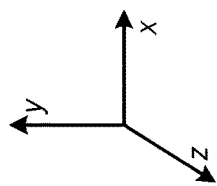

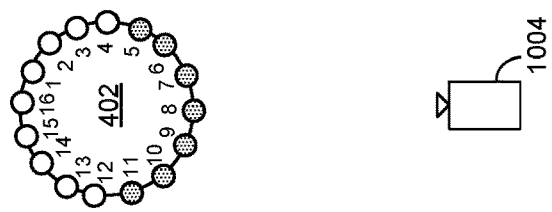
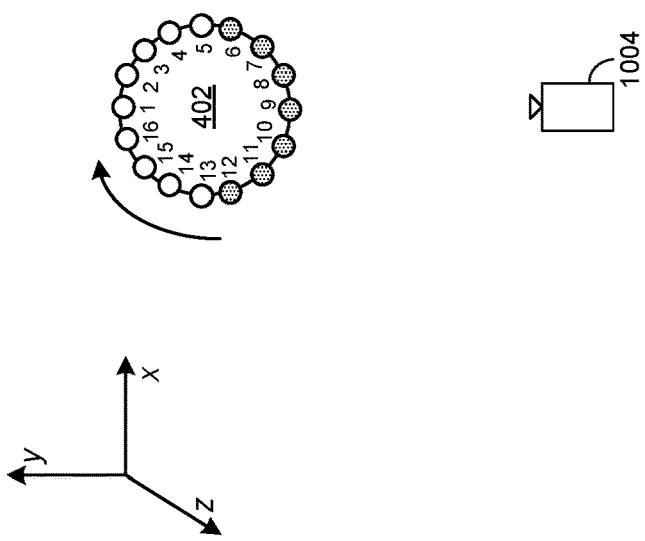
FIG. 11B
FIG. 11A

US 10,802,282 B2

CONTROLLING LIGHT SOURCE INTENSITIES ON OPTICALLY TRACKABLE OBJECT

BACKGROUND

Computing devices may optically track user gestures as an input mechanism. In some systems, user gestures may be tracked by tracking via a camera a peripheral device held by or worn on a user.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to dynamically controlling light sources on an optically trackable peripheral device. One disclosed example provides a near-eye display device comprising an image sensor, a communications subsystem, a logic subsystem, and a storage subsystem. The storage subsystem stores instructions executable by the logic subsystem to control a peripheral device comprising a plurality of light sources by receiving image data from the image sensor, identifying in the image data a constellation of light sources formed by a subset of light sources of the peripheral device, and based upon the constellation of light sources identified, send to the peripheral device via the communications subsystem constellation information related to the constellation of light sources identified.

Another disclosed example provides a peripheral device configured to be held or worn by a user, the peripheral device comprising a plurality of light sources, a communications subsystem configured to receive constellation information from a remote computing device regarding a constellation of light sources of the peripheral device detected by the remote computing device in image data, and a controller. The controller is configured to, based upon the constellation information received, determine an intensity at which to illuminate each light source within the constellation of light sources, and adjust the intensity of one or more light sources based on the intensities determined.

BRIEF DESCRIPTION OF THE DRAWINGS

FIG. 3 shows an example light source intensity calibration table.

FIGS. 4A-4B illustrate an example light source intensity adjustment based upon a position of a peripheral device within a field of view of a head-mounted device.

FIGS. 6A-6B schematically illustrate an example light source intensity adjustment based on a motion of the peripheral device of FIG. 1 toward a field of view of the head-mounted device.

FIGS. 10, 11A and 11B illustrate aspects of the example calibration method of FIG. 9.

DETAILED DESCRIPTION

Figure 1:
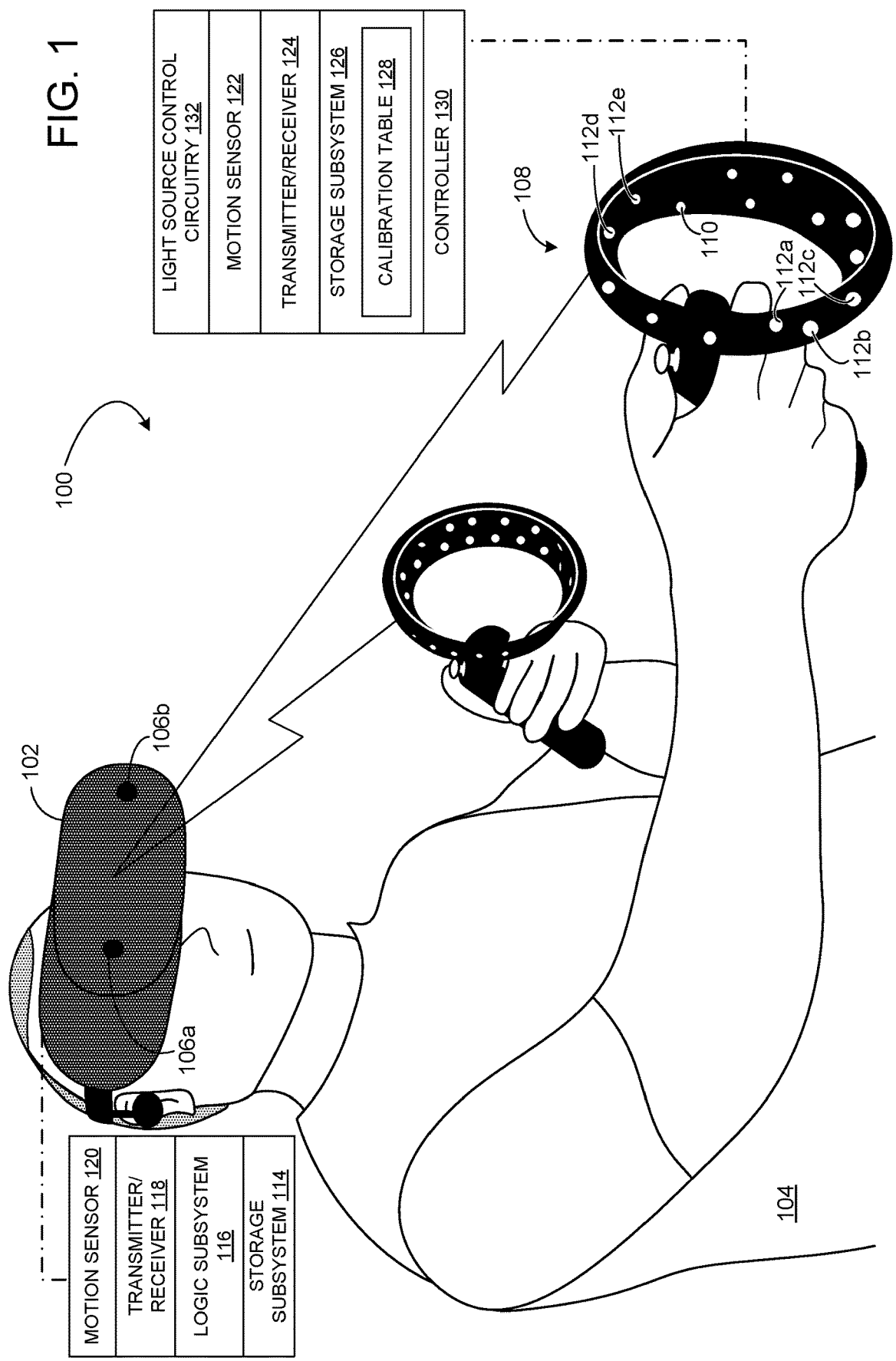
FIG. 1 shows a use scenario in which an example peripheral device comprising a plurality of light sources is optically tracked.

As mentioned above, a computing device may be configured to recognize user gestures as input. In some such devices, user gestures may be tracked by optically tracking a peripheral device held by or worn on a user. To facilitate such tracking, the peripheral device may comprise a plurality of light sources (infrared and/or visible) arranged at known locations on the peripheral device. Different patterns of light sources will be detected in image data based upon the position of the light sources relative to an image sensor capturing the image data. By identifying the light sources in an image frame (e.g. by fitting the observed light source pattern to a three-dimensional model of the light sources), the position of the peripheral device may be identified in each frame of image data.

Such light sources may be powered continuously during use, regardless of whether each light source is currently detectable via an image sensor. Thus, a relatively large fraction of light sources that are illuminated may be occluded from view or facing away from the image sensor in an image frame. Thus, continuously powering all light sources of the peripheral device may result in unnecessarily high power consumption and more frequent battery charging or replacement.

Further, the imaged light sources may appear not to have uniform brightness in image data, even where all light sources are evenly illuminated. For example, light sources viewed at low angle by the image sensor may appear to be brighter than those viewed at larger angles due to the angular intensity distribution of each light source having a peak intensity along an optical axis of the light source. Likewise, light sources may appear to be brighter when the peripheral device is closer to an image sensor than when farther away. Shorter distances between the peripheral device and the image sensor may cause light sources directly facing the image sensor to saturate the image sensor pixels. However, reducing the intensity of all light sources equally to avoid such saturation may cause light sources at higher angles relative to the image sensor to become difficult to perceive, which may impact optical tracking performance.

Accordingly, examples are disclosed that may help to address such problems. Briefly, the disclosed examples relate to dynamically adjusting an intensity of each of one or more light sources of a peripheral device based on a determined pose of the peripheral device relative to the computing device and/or movement of the peripheral device relative to the computing device. An image sensor (which may be integrated with the computing device or separate from the computing device) captures images of the peripheral device and provides the image data to the computing device. The computing device detects in the image data a subset of light sources (a "constellation") of the peripheral device and communicates constellation information to the peripheral device via a wired or wireless connection. Based on the constellation information received, the peripheral device adjusts an intensity of one or more light sources according to pre-calibrated constellation-specific intensity values. As examples, light sources at lower angles relative to the image sensor may be illuminated at lower intensities than those at higher angles. Further, the intensity of light sources out of view may be reduced to zero. This may help to improve battery life, and may facilitate object tracking by providing for more uniform apparent intensities as sensed by the image sensor. Further, the disclosed examples may help to normalize power consumed by light sources within a constellation of light sources.

FIG. 1 shows an example use scenario for a VR display system 100 in which a computing device in the form of a near-eye display (NED) device 102, worn by a user 104, displays immersive virtual reality imagery. An outward-facing image sensor 106 (here a stereo camera arrangement comprising a first camera 106a and a second camera 106b) of the NED device 102 acquires image data of a surrounding real-world environment in which peripheral devices 108 are held by the user 104. While described in the context of a virtual reality NED device, object tracking as disclosed herein may be utilized to control any other suitable computing device, including but not limited to augmented reality (AR) and/or mixed reality (MR) display devices, other wearable devices, desktop devices, laptop devices, tablet devices, and mobile devices.

The peripheral devices 108 are depicted in this example as controllers for a video game system. Each peripheral device 108 takes the form of a wireless device configured to be used to make gesture inputs having six degrees of freedom (6 DOF). Each peripheral device 108 includes a plurality of light sources (one of which is shown as 110) to assist in optical tracking of the peripheral device 108. In FIG. 1, the plurality of light sources 110 are distributed along both an exterior and an interior of a ring-like structure of the peripheral device 108. The light sources 110 are configured to be detected as constellations in image data acquired by the image sensor 106 of the NED device 102, such that a pose of the peripheral device 108 may be determined from the image data based at least on the constellation detected. In other examples, a peripheral device may include a wired connection to a computing device.

As mentioned above, some light sources of the peripheral device 108 may be occluded from a view of the image sensor 106 during use. In the example of FIG. 1, light sources 112a-e are occluded. The peripheral device 108 thus may power off these light sources (e.g. adjust an intensity of each light source 112a-e to zero) when the peripheral device 108 receives constellation information from the NED device 102 indicating that these light sources 112a-e are not within a constellation of light sources detected or, in some examples, predicted to be detected by the NED device 102.

Figure 12:
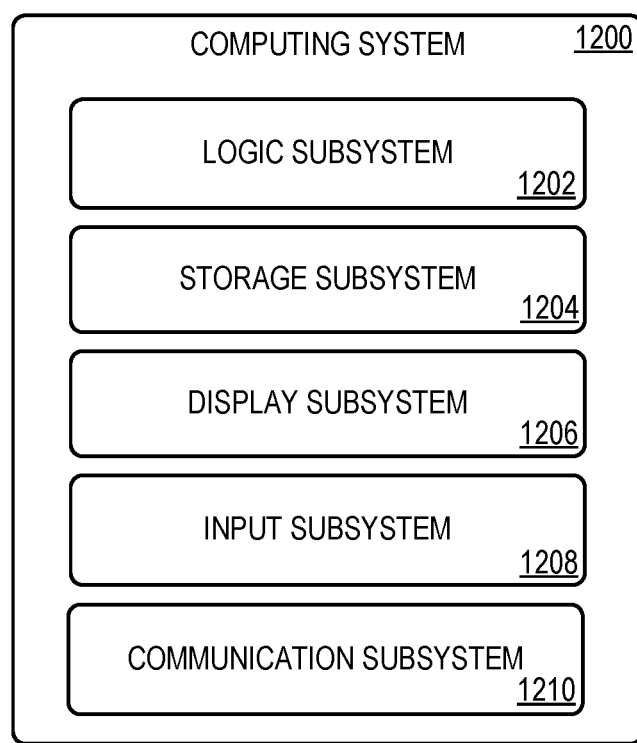
FIG. 12 shows a block diagram of an example computing system.

The NED device 102 comprises a storage subsystem 114, a logic subsystem 116, and a communication subsystem 118 (e.g. a wireless transmitter and receiver), examples of which are described in more detail herein with respect to FIG. 12. The storage subsystem 114 may store, for example, a three-dimensional model of the peripheral device 108 including positions and orientations of light sources 110 residing on the peripheral device 108. The logic subsystem 116 is configured to receive image data from the image sensor 106 of the NED device 102 and identify within the image data a constellation of light sources formed by a subset of light sources of the peripheral device. In some examples, light sources are identified within an image by thresholding the image to find approximate light source locations, and then fitting a statistical curve (e.g. a Gaussian function) to the threshold images to locate the light sources on a pixel or sub-pixel basis. Epipolar line fitting, a rigid body transformation, or any other suitable method may be used to identify a constellation of light sources of the peripheral device that corresponds to the light source locations detected within the image data. Based on the constellation of light sources identified, the NED device 102 sends constellation information to the peripheral device 108.

In some examples, the NED device 102 may comprise a motion sensor 120 (e.g. one or more of a magnetometer, gyroscope, accelerometer, and/or other suitable sensor) configured to detect motion of the NED device 102. In addition or alternatively to a motion sensor 120, the NED device 102 may be configured to determine a movement of the NED device 102 relative to the peripheral device 108 (and/or relative to the surrounding real-world environment) via image data obtained by the image sensor 106, for example, by visually tracking a position and/or orientation of one or more features in the real-world environment on a frame-to-frame basis. In some examples, such motion tracking may be used, for example, to predict a constellation of light sources of the peripheral device 108 likely to be viewed in a future image frame (e.g. within the next 10-20 ms).

The peripheral device 108 comprises a motion sensor 122 (e.g. one or more of a magnetometer, gyroscope, accelerometer, and/or other suitable sensor) that provides output related to motion of the peripheral device, including movement and changes in position and/or orientation. Motion data obtained by the motion sensor 122 may be sent to the NED device 102 via communication subsystem 124.

In some examples, the NED device 102 and the peripheral device 108 are configured to communicate with one another directly. In other examples, an optional host computing device (e.g. a personal computer, a game console, etc.) (not shown) may communicate with the NED device 102 and the peripheral device 108. The host computing device may process data (e.g. image data, motion data) received from the NED device 102 and the peripheral device 108, and send control signals to the NED device 102 and the peripheral device 108. The specific communication channels described herein are for the purpose of example, and any other suitable communications channels, wired (e.g. universal serial bus) and/or wireless, may be used for NED-to-host communication, host-to-peripheral device communication, and/or NED-to-peripheral device communication.

Continuing with FIG. 1, the peripheral device 108 further comprises a storage subsystem 126 storing a calibration table 128. As described in more detail with respect to FIG. 3, the calibration table 128 includes constellation-specific intensity values for each light source of the peripheral device 108 for each of a plurality of possible constellations. The constellation-specific intensity values provide, for each of a plurality of constellations that may be sensed by the NED device 102, intensity values for each light source of the peripheral device at which the light sources may appear to an image sensor to have suitably uniform intensities. The constellation-specific intensity values for each constellation also may comprise values specifying zero intensity for light sources not visible to an image sensor when that constellation is imaged.

A controller 130 residing on the peripheral device 108 is configured to control a power provided to each light source based upon intensity values in the calibration table 128 that correspond to the constellation information received from the NED device 102. The controller 130 may be implemented via any suitable hardware, software, and/or firmware. In some examples, the controller 130 comprises a microcontroller (MCU) and/or a system-on-chip (SoC).

The light sources 110 of each peripheral device 108 may take any suitable form, such as light-emitting diodes (LEDs) that emit visible light for detection via a visible light camera or cameras of the NED device 102. Infrared (IR) light sources (e.g. IR LEDs) also may be used, for detection via an IR light camera or cameras of the NED device 102. In some examples, the image sensor 106 of the NED device 102 may be configured to filter wavelengths of light other than those emitted by the light sources 110, which may help to reduce noise levels in the image data. In some examples, the peripheral device 108 comprises from twenty to forty light sources. In a more specific example, the peripheral device 108 comprises thirty-two light sources. In other examples, a peripheral device 108 may have any other suitable number of light sources, and the light sources may be arranged in any suitable pattern.

Figure 2:
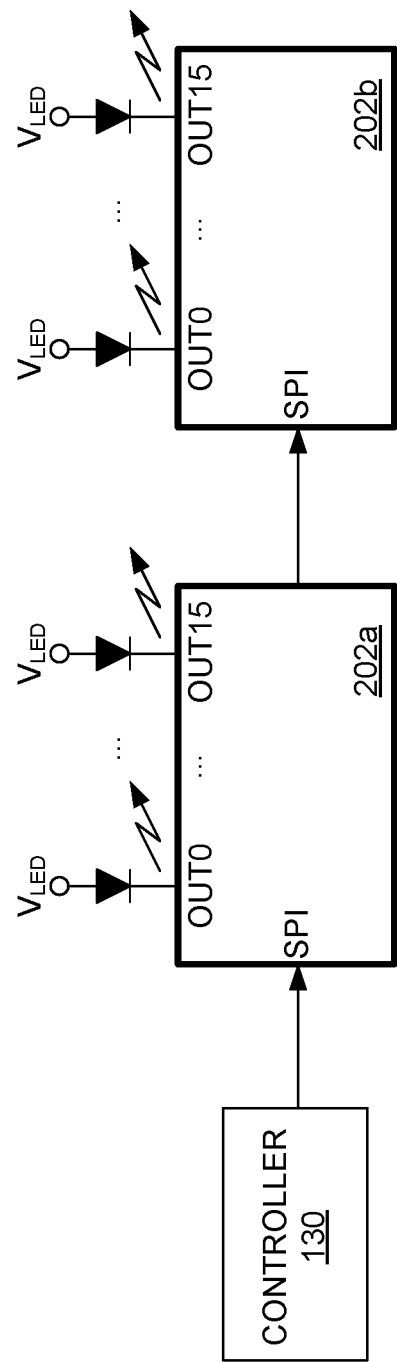
FIG. 2 shows a schematic diagram of example light source control circuitry.

The controller 130 may provide signals to any suitable circuitry 132 to control the power provided to individual light sources of the peripheral device 108. FIG. 2 shows one example of such circuitry comprising LED drivers 202a, 202b configured to output a suitable amount of power based upon control signals received from controller 130. In this example, each LED driver 202a, 202b comprises a 16-channel serial peripheral interface (SPI) LED parallel driver, such that two drivers control the power supplied to each of 32 individual LED light sources. In a more specific example, the SPI LED parallel drivers may comprise a 30 MHz data transfer rate and a 40 mA constant current sink output capability. In other examples, any suitable drivers may be used to control power supplied to any suitable number of light sources.

The calibration table 128 may take any suitable form. For example, the calibration table 128 may store constellation-specific intensity values for a same number of constellations as a number of light sources on the peripheral device 108, wherein each constellation is based upon an identity of a light source at a lowest angle to the image sensor of a currently detected constellation. FIG. 3 depicts an example calibration table 300 comprising, for each constellation of n constellations, light source intensity information for each of a plurality of light sources. In this example, the leftmost column 302 of the calibration table 300 indicates an index light source for each row. In some examples, the index light source may comprise a centermost light source (e.g. smallest viewing angle) of a currently detected constellation. For a stereo camera arrangement comprising two or more cameras, the centermost light source may be located at an approximate center of a region in which a field of view of each camera overlaps.

Each row of the calibration table 300 further comprises constellation-specific intensity values for each light source of the peripheral device for the constellation represented by the index light source. For example, the first row 304 of the calibration table 300 includes an entry L(1), B(1), where L(1) indicates index LightSource1 (the center light source of the constellation) and B(1) is the center light source brightness within the constellation indexed by LightSource1. In the next column of the first row 804, entry L(11), B(11) indicates a brightness B(11) for a first light source other than the center light source within the constellation indexed by LightSource1 (L(11)). In the next column, L(12), B(12) indicates a brightness B(12) for a second light source other than the center light source within the constellation indexed by LightSource1 (L(12)). The first row 304 further includes brightness values for all other light sources n for the constellation indexed by LightSource1. More generally, in each table row, L(IJ) indicates LightSourceJ in constellation I, and B(IJ) indicates the brightness of this light source. As some light sources may be out of view of the image sensor in each constellation, the calibration table 300 may store intensity values of zero for one or more out-of-view light sources. Further, the calibration table 300 may store either zero or non-zero intensities for light sources that are in a buffer zone neighboring those light sources in view but that themselves are out of view. Storing non-zero values for such light sources may ensure that such light sources can be imaged if they come into view quickly as a user moves.

In some examples, a calibration table may include additional rows. For example, a calibration table may store multiple rows for each index light source, wherein each row corresponds to a different direction of motion of the peripheral device. Such rows may specify to illuminate light sources that are not currently in view but that may come into view based upon the current motion. In other examples, additional light sources may be illuminated predictively based upon motion using logic implemented on controller 130.

FIG. 4A schematically illustrates example adjustments that may be made to light source intensities based upon a change in position of a peripheral device 402 within a field of view of image sensors on a NED device 404. The example peripheral device 402 comprises sixteen light sources, but may have any other suitable number. In this example, the user 406 rotates the peripheral device 402 counterclockwise from the perspective of the figure and moves the peripheral device towards a left side of the field of view. In FIG. 4A, the NED device 404 detects a constellation of light sources with light source 9 at a lowest angle to the image sensor, and sends constellation information (shown as communication 408a) to the peripheral device 402 identifying the detected constellation as being indexed by light source 9. The constellation information may comprise simply an identity of the index light source of the constellation, a list of light sources detected, and/or any other suitable constellation information. In response, the peripheral device 402 accesses the calibration table 128 (FIG. 1) to determine the pre-calibrated light source intensities for each light source of the peripheral device 402 for index light source 9. The peripheral device 402 then illuminates light sources 5 through 13 of the peripheral device 402 at various intensities such that the imaged light sources have suitably uniform intensities, plus some out-of-view neighboring light sources as a buffer to account for potential motion of the peripheral device. Light sources 14-16 and 1-4, which are out of view of the image sensor and outside of the buffer zone, are powered off.

FIG. 4B depicts the peripheral device 402 after the rotation and translation shown in FIG. 4A. Here, the NED device 404 detects a constellation of light sources indexed by light source 7 and sends the index 7 to the peripheral device 402, as indicated by communication 408b. The peripheral device 402 illuminates light sources 3 through 10 based upon constellation-specific intensities stored in the calibration table for the constellation indexed by light source 7. In this example, light sources 4 through 9 are currently in view and are illuminated at various power levels to appear suitably uniform in intensity to the image sensors of the NED device 404. Light sources 3 and 10 are out of view, but are neighboring those that are viewable and are illuminated to serve as a buffer to accommodate motion of the peripheral device 402 prior to the next image frame.

As mentioned above, in some examples, light sources other than the ones in a currently imaged constellation may be illuminated predictively. For example, when the peripheral device 402 is within a field of view of the image sensors and moving, motion data detected by the NED device 404 and/or the peripheral device 402 may be used to determine light sources likely to come into view in one or more future image frames (e.g. within the next 10-20 ms). As one more specific example, based on a current position and/or orientation of a peripheral device relative to a NED device and motion data, the NED device may send a rough prediction of a quadrant (or other fraction of the field of view) and/or orientation where the peripheral device may be located in a future image frame. In some such examples, the peripheral device 108 may use the calibration table to determine a subset of light sources likely to be viewable by the image sensor 106 when the peripheral device is in the predicted quadrant and/or orientation. As another more specific example, the NED device may utilize a ray-tracing model to trace a last known (or predicted) position of the peripheral device to a future position, for example, based on a current velocity and/or acceleration vector of the peripheral device relative to the NED device. This determination then may be used to trigger the peripheral device 402 to illuminate light sources that are not in a currently imaged constellation but that are likely to be imaged in a near future image frame.

Similarly, the size of a buffer of neighboring light sources illuminated may change based upon motion data detected by the NED device 404 and/or the peripheral device 402. For example, when the peripheral device 402 is moving and/or accelerating slowly (e.g. <a threshold velocity and/or acceleration) relative to the NED device 404, a lesser number of neighboring light sources may be illuminated than when the peripheral device 402 is moving and/or accelerating quickly (e.g. ≥the threshold velocity and/or acceleration) relative to the NED device 404.

Figure 5B:
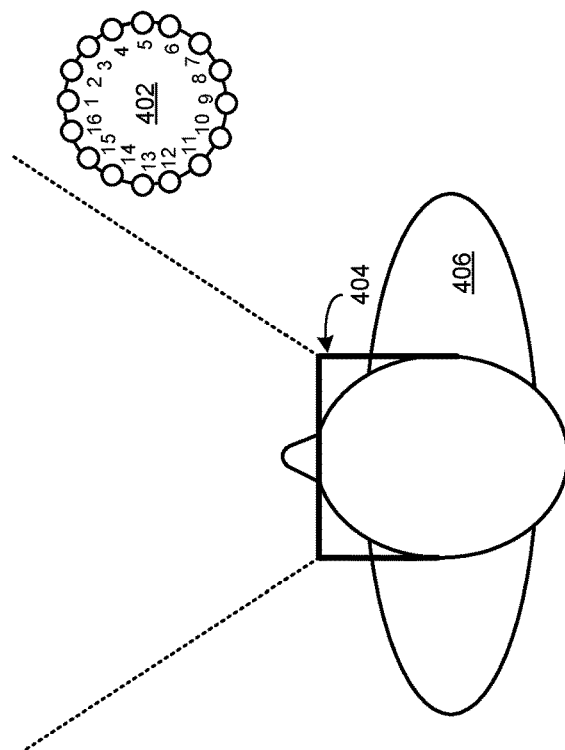
FIGS. 5A-5B schematically illustrate an example light source intensity adjustment based on a position of the peripheral device outside of a field of view of the head-mounted device.
Figure 5A:
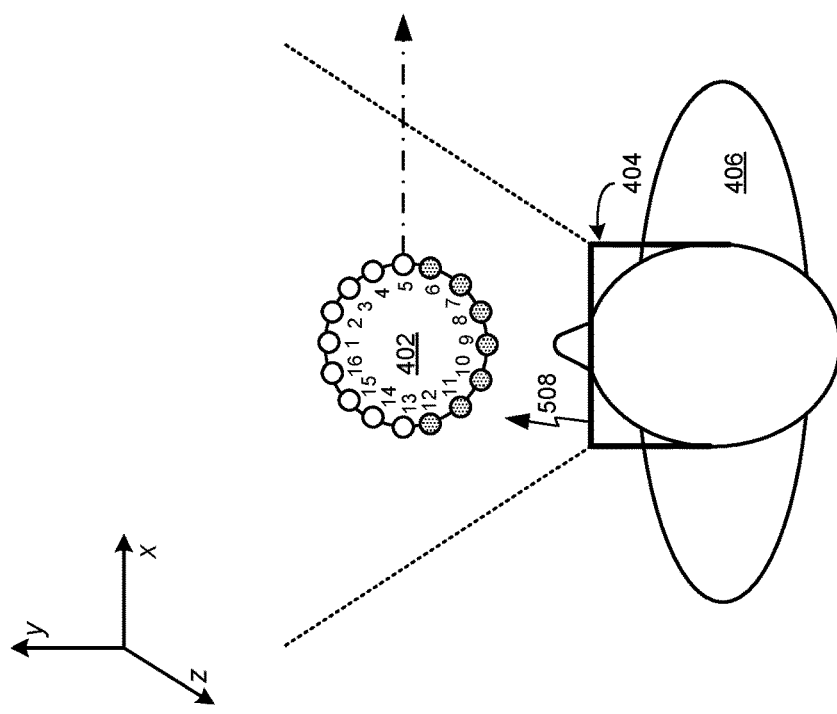

Other strategies may be utilized to control light source intensities for power savings and/or tracking performance. For example, when a peripheral device is determined to not be in motion (e.g. for a threshold duration of time or number of image frames), the intensities of the light sources may be adjusted to zero for power savings. This also may be done when the peripheral device is determined to have moved out of a field of view of the NED device image sensors. FIGS. 5A-5B show an example scenario in which the peripheral device is moved from within a field of view of the NED device 404 to a location outside the field of view. When the NED device 404 no longer detects the peripheral device 402 within the field of the view, the NED device 404 sends a control signal 508 to the peripheral device 402 to trigger a controller of the peripheral device 402 to power off all light sources. As shown in FIG. 5B, the peripheral device 402 powers off all light sources upon receiving the control signal indicating that the peripheral device 402 is outside of the field of view. This may help preserve battery life.

Likewise, to preserve tracking performance, when a peripheral device is outside of the field of view and the light sources have been powered off, but is moving towards the field of view, the peripheral device may power on all light sources so that the peripheral device may quickly resynchronize with the NED device. Referring first to FIG. 6A the peripheral device 402 is outside of the field of view of the NED device 404 and all light sources of the peripheral device 402 are powered off. The peripheral device 402 begins moving towards the field of view of the NED device 402 and communicates motion data to the NED device 404 (e.g. a current acceleration vector for the peripheral device). In response, the NED device 404 sends to the peripheral device 402 a control signal 608 that triggers the peripheral device 402 to power on all light sources. In other examples, the control signal may be internally generated by the peripheral device 402, e.g. based upon motion data from motion sensors on the peripheral device 402 combined with a most recent optical tracking position communicated by the NED device 404.

FIG. 6B shows the peripheral device 402 with all light sources powered on prior to reentering the field of view. Once the peripheral device 402 appears within view of the image sensor of the NED device 404, the NED device 404 may capture image data of the peripheral device 402, identify a constellation of light sources within the image data, and communicate constellation information to the peripheral device 402. The peripheral device 402 then may reference the calibration table 128 (FIG. 1) to identify an appropriate intensity value for each light source based on the constellation information received, and adjust an intensity of one or more light sources accordingly.

Figure 7:
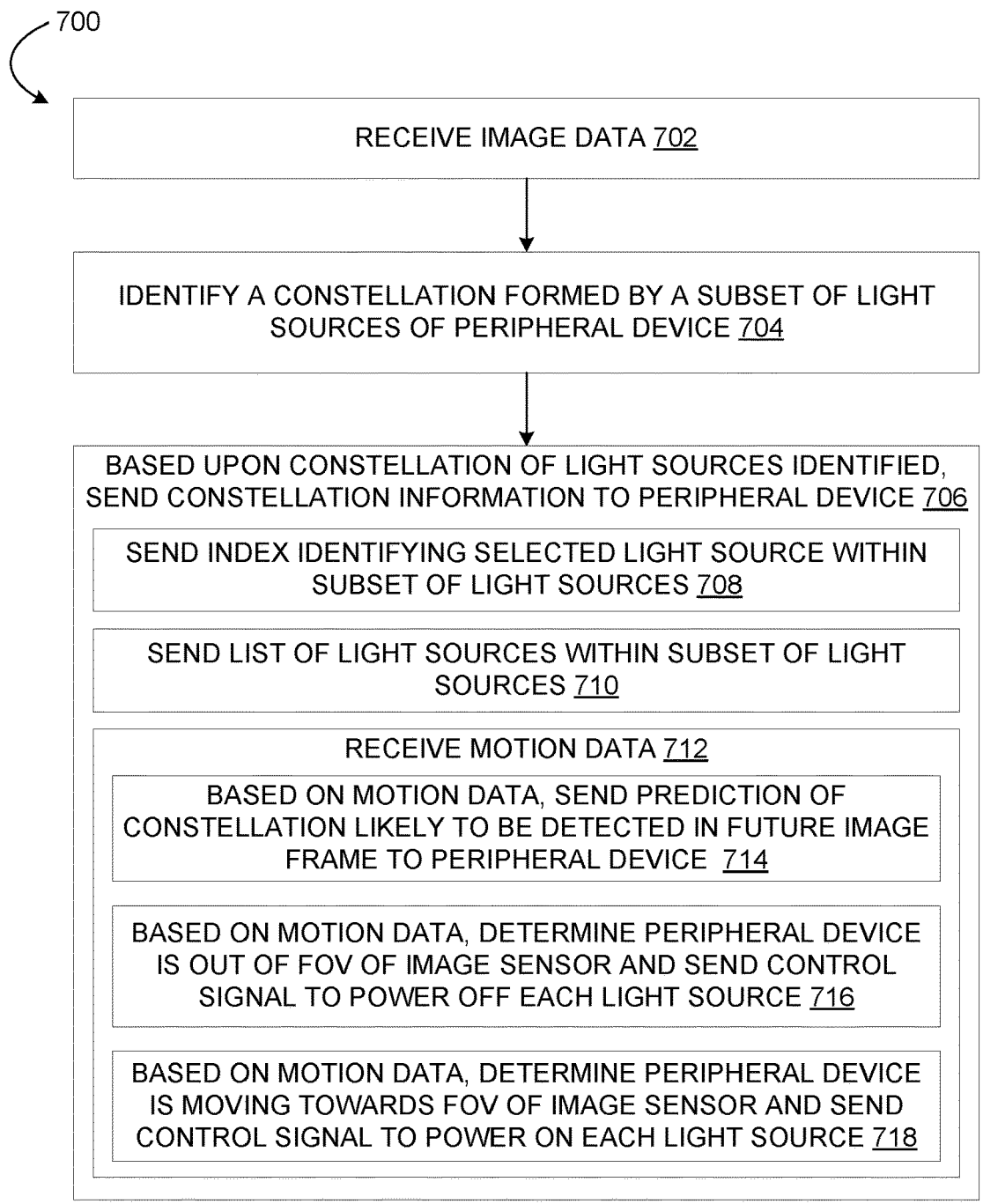
FIG. 7 shows a flowchart illustrating an example method for sending constellation information to a peripheral device to control the peripheral device.

FIG. 7 shows a flow diagram illustrating an example method 700 for sending constellation information to a peripheral device. Method 700 may be implemented as stored instructions executable by a logic subsystem of a computing device that images the peripheral device, such as NED device 102 and NED device 404, as well as other types of computing devices (e.g. desktops, laptops, mobile devices, tablet devices, etc.).

At 702, method 700 comprises receiving image data from an image sensor. Receiving image data may comprise receiving image data from an image sensor configured to image visible light, and/or from an image sensor configured to image infrared light. Any suitable image sensor may be used. In some examples, the image sensor comprises a stereo camera arrangement including two or more cameras configured to resolve depth within the image data. In other examples, a single image sensor, rather than a stereo arrangement, may be used.

At 704, method 700 comprises identifying in the image data a constellation of light sources formed by a subset of light sources of the peripheral device. Any suitable image analysis technique may be used to identify the constellation of light sources in the image data. For example, a computing device may threshold an image to find approximate light source locations, and then fit a statistical curve (e.g. a Gaussian function) to the threshold image to locate the light sources on a pixel or sub-pixel basis. Epipolar line fitting, a rigid body transformation, or any other suitable method may be used to identify a constellation of light sources of the peripheral device that corresponds to the light source locations detected within the image data. The computing device also may utilize motion data obtained from a motion sensor of the computing device and/or the peripheral device in estimating a pose of the peripheral device relative to the computing device.

Based upon the constellation of light sources identified, method 700 further comprises, at 706, sending constellation information to the peripheral device. The constellation information triggers the peripheral device to adjust an intensity of one or more light sources of the peripheral device, such that light sources not in view of the image sensor may be powered off and light sources within view or likely to come within view of the image sensor may be illuminated to exhibit suitably uniform intensities from a perspective of the image sensor. In some examples, the constellation information may be sent at a same frame rate used by the image sensor to acquire images, e.g. 90 Hz. The constellation information may comprise any suitable information usable by the peripheral device to adjust light source intensities as disclosed. In some examples, the constellation information comprises an index identifying a selected light source within the subset of light sources detected in the image data, as indicated at 708. In a more specific example, the index may comprise an identification of a centermost light source within the subset of light sources detected, e.g. as defined by a light source that has the smallest viewing angle from a perspective of the image sensor. In other examples, sending the constellation information may comprise sending a list of light sources within the subset of light sources detected, as indicated at 710. In yet other examples, any other suitable constellation information related to the constellation of light sources identified may be sent to the peripheral device.

As mentioned above, motion data may be used to further inform the constellation information sent to the peripheral device. Method 700 thus may comprise receiving motion data, as indicated at 712. Receiving motion data may comprise receiving motion data from a motion sensor residing on the peripheral device and/or from a motion sensor residing locally on the computing device. Additionally or alternatively, receiving motion data may comprise receiving image data and determining a movement of the peripheral device relative to the computing device based on image data. In any instance, based on the motion data, the computing device may predict a constellation of light sources of the peripheral device likely to be detected in a future image frame, as indicated at 714, and send constellation information related to the predicted constellation of light sources to the peripheral device. In other examples, the computing device may send the motion data to the peripheral device, and the peripheral device may predict a constellation of light sources likely to be detected in a future image frame.

In some examples, the computing device may determine via image data that the peripheral device is outside of a field of view of the image sensor, for example, by not detecting light sources of the peripheral device in a threshold number of consecutive image frames. Likewise, based on motion data received, the computing device may determine that the peripheral device is not moving (or not moving relative to the computing device). In either instance, the computing device may send a control signal to the peripheral device to trigger the peripheral device to power off each light source, as indicated at 716. Further, when the peripheral device light sources are powered down and the peripheral device is outside of a field of view of the image sensors of the computing device, the computing device may determine, based on the motion data, that the out-of-view peripheral device is moving towards the field of view of the image sensor, and in response may send a control signal to the peripheral device to trigger the peripheral device to power on each light source, as indicated at 718.

Figure 8:
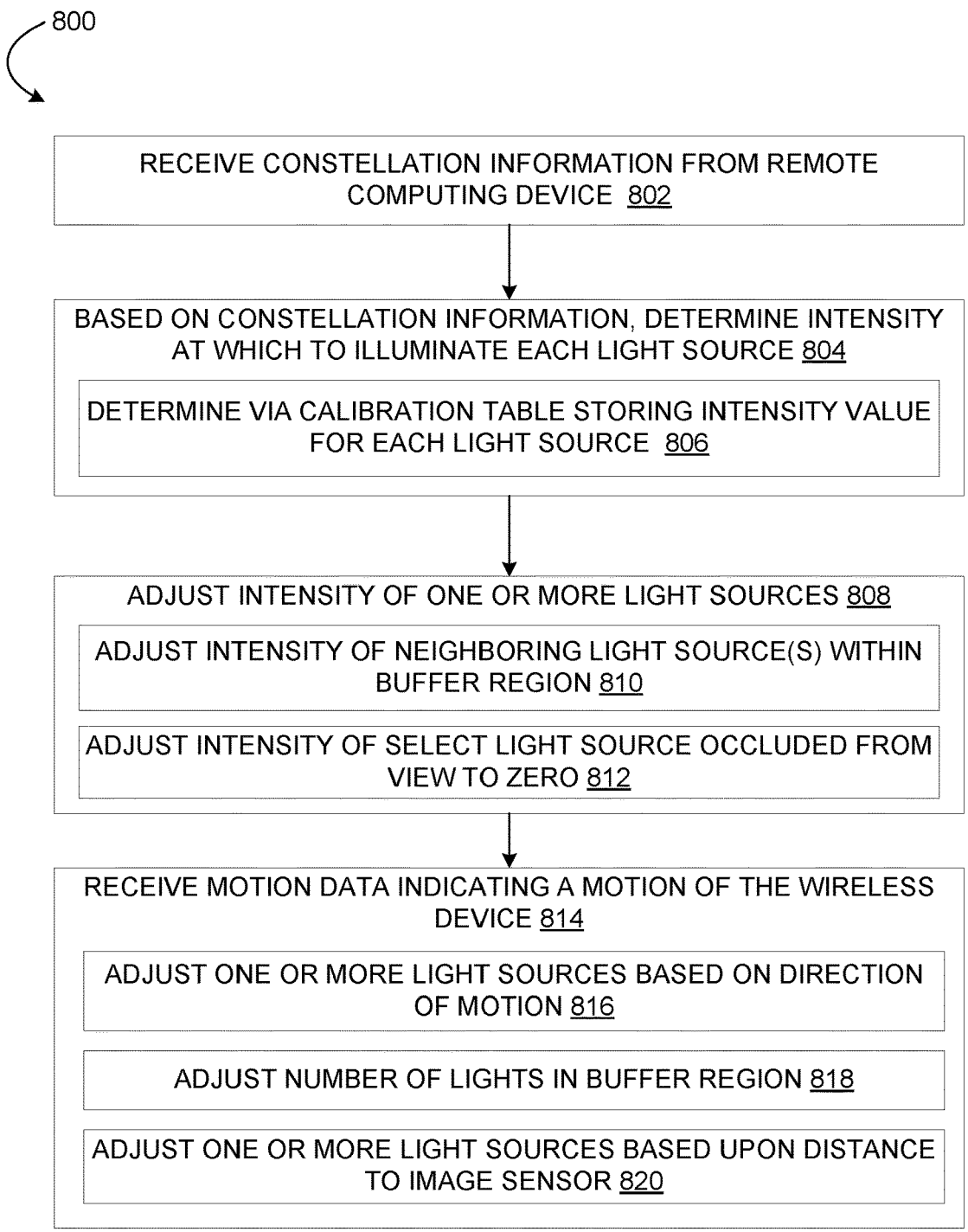
FIG. 8 shows a flowchart illustrating an example method for adjusting an intensity of each of one or more light sources based upon received constellation information.

FIG. 8 shows a flowchart illustrating an example method 800 for adjusting an intensity of one or more light sources of a peripheral device. Method 800 may be implemented as stored instructions executable by a controller of a peripheral device, such as peripheral device 108 and/or 402.

At 802, method 800 comprises receiving constellation information from a remote computing device (e.g. a NED device). The peripheral device may receive the constellation information directly from the remote computing device via respective communication subsystems of each device, or may receive the constellation information from an intermediary host computing device communicatively coupled to the remote computing device and the peripheral device. In some examples, receiving constellation information comprises receiving an index identifying a selected light source of the constellation of light sources (e.g. a centermost light source as viewed from the image sensor). In other examples, receiving constellation information comprises receiving a list of light sources detected by the remote computing device. In yet other examples, the constellation information may include any suitable information related to the constellation of light sources detected (or predicted as likely to be detected) by the remote computing device.

Based on the constellation information received, method 800 comprises, at 804, determining an intensity at which to illuminate each light source. Determining the intensity at which to illuminate each light source may comprise accessing a calibration table (e.g. calibration table 128 in FIG. 1, calibration table 300 in FIG. 3) storing intensity values for each light source within the constellation of light sources, as indicated at 806.

At 808, method 800 comprises adjusting an intensity of each of one or more light sources based on the intensities determined. This may comprise illuminating all light sources within a constellation of light sources identified according to constellation-specific intensity values for each light source in the constellation table. Adjusting the intensity of the one or more light sources also may comprise illuminating one or more neighboring light sources proximate to a light source(s) within the constellation identified, for example, as a buffer to account for possible movement of the peripheral device relative to the NED, as indicated at 810. Further, method 800 may comprise adjusting an intensity of select light source(s) occluded from view to zero, as indicated at 812.

In some examples, motion data may be used to inform light source intensity adjustments. As such, at 814, method 800 comprises receiving motion data indicating motion of the peripheral device. Receiving motion data may comprise receiving motion data from a motion sensor of the peripheral device, and/or may comprise receiving motion data from the remote computing device. Based on the motion data received, method 800 may comprise adjusting a power provided to one or more light sources.

For example, the motion data may indicate a direction of motion of the peripheral device (e.g. a direction of a rotation and/or translation), and the peripheral device may adjust an intensity of one or more light sources based on the direction of motion, as indicated at 816. This may comprise preemptively illuminating one or more light sources likely to come into view of the image sensor based upon the motion data. Motion data also may be used to adjust a number of lights within a buffer region, as indicated at 818. As one example, the motion data may indicate that the peripheral device is moving and/or accelerating quickly, and may inform the controller of the peripheral device to increase a buffer of neighboring light sources that are illuminated. Increasing the buffer may comprise determining one or more light sources likely to be detected in a future image frame and preemptively increase an intensity of each image light source determined. The motion data likewise may inform the controller to maintain or decrease the buffer of neighboring light sources illuminated, for example, based on the peripheral device moving and/or accelerating slowly. This may help to maintain tracking of the peripheral device in image data as the peripheral device changes pose relative to the remote computing device. Further, motion data may indicate a change in distance between the computing device and the peripheral device. As a perceived brightness of a light source may decrease as a distance between the peripheral device and the image sensor increases, and may increase as the distance decreases, method 800 may comprise adjusting an intensity of one or more light sources based upon the distance between the image sensor and the peripheral device, as indicated at 820.

The examples disclosed herein may provide advantages over display systems that utilize globally controlled light sources, which may be subject to costly, time-intensive sourcing and manufacturing processes. For example, to obtain a plurality of light-emitting diodes (LEDs) having substantially similar brightness characteristics, a supplier may test, sort, and bin LEDs according to various parameters (color, lumen output, forward voltage, etc.). Such sorting and binning are time intensive, and thus increase materials and manufacturing costs. In contrast, in the disclosed examples, all light sources of a peripheral device are calibrated on a per-constellation basis, such that each light source is individually calibrated to illuminate at a suitable intensity in each constellation position. This may reduce or eliminate the need to perform LED binning and resistor matching.

Figure 9:
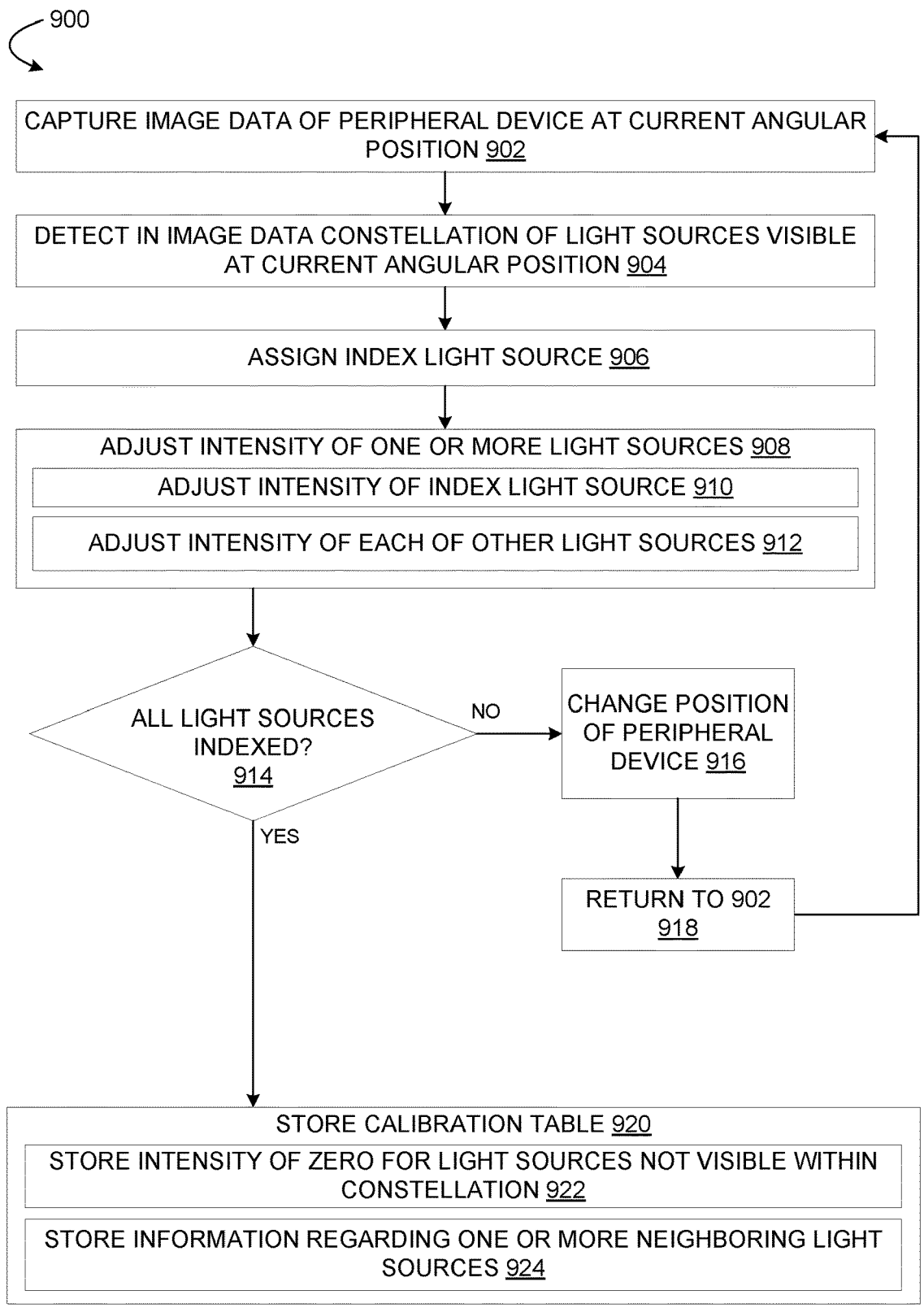
FIG. 9 shows a flowchart illustrating an example method for calibrating light sources of a peripheral device.
Figure 10:
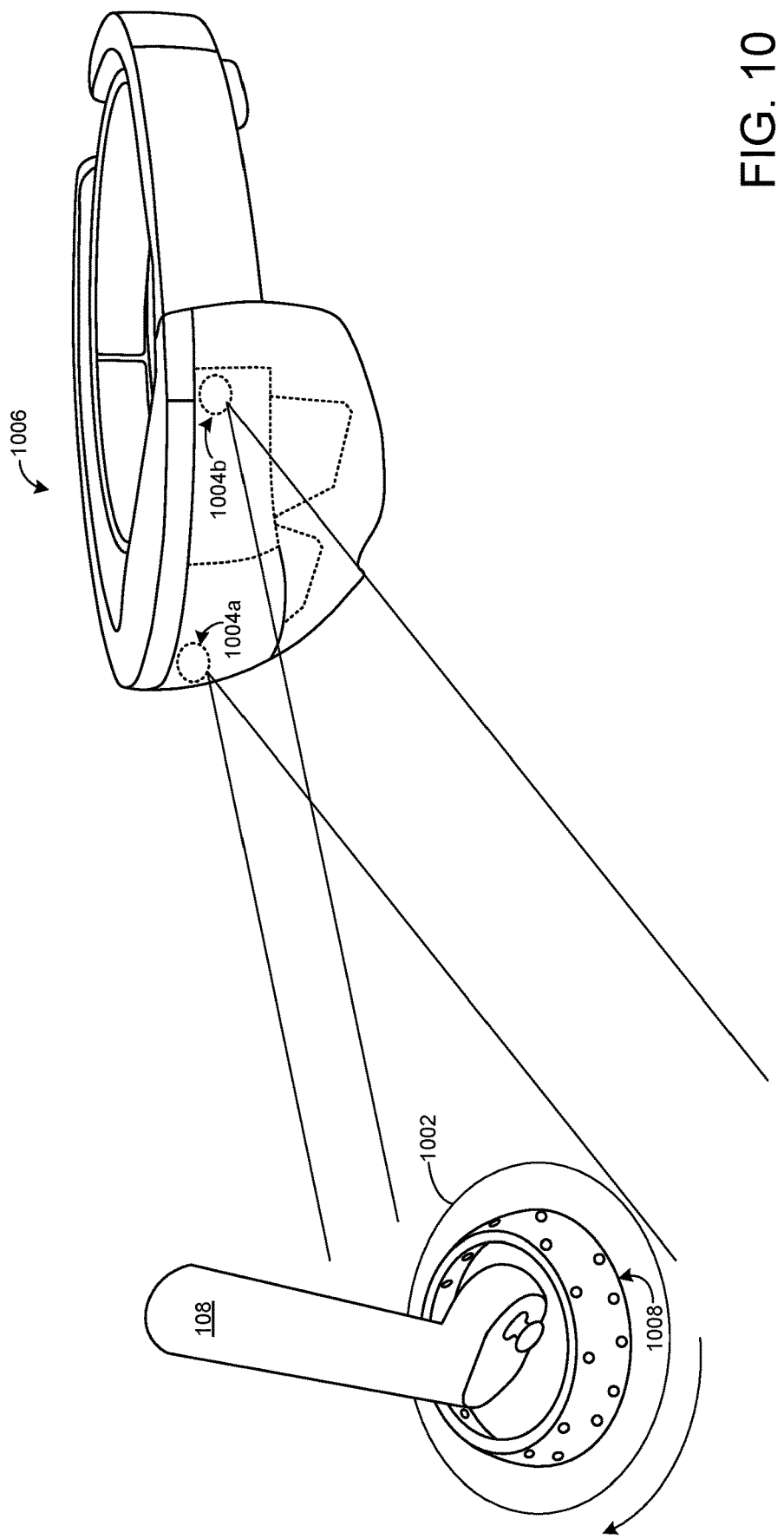

FIG. 9 shows a flowchart illustrating an example method 900 for calibrating light sources of a peripheral device. Method 900 may be implemented as a manufacturing process, for example. At 902, method 900 comprises capturing image data of a peripheral device at a current angular position. FIG. 10 shows an example calibration process in which an image sensor 1004 (a stereo camera arrangement comprising a first camera 1004a and a second camera 1004b) of an imaging computing device 1006 is in a fixed location, and the peripheral device 108 is positioned on a rotating mount 1002. FIG. 11A depicts the peripheral device 402 at a current first angular position 1102, where light sources 6 through 12 of the peripheral device 402 are within view of the image sensor 1004. The image sensor 1004 captures an image of the peripheral device 402 at the first angular position 1102.

Continuing with FIG. 9, method 900 comprises, at 904, detecting in the image data a constellation of light sources visible at the current angular position. It will be understood that the term "visible" refers to the constellation being viewable from a perspective of the image sensor, and does not necessarily indicate that the light sources emit visible light. Detecting the constellation of light sources may comprise thresholding image data obtained of the peripheral device at the current angular position to identify bright pixels or sub-pixels with respect to pixels. Any other suitable method for detecting one or more light sources within the image data also may be used.

At 906, method 900 comprises, assigning an index light source for the current constellation of light sources. For example, the computing device may determine a centermost light source (e.g. smallest viewing angle with respect to image sensor) within a detected constellation of light sources, and assign the centermost light source as the index light source for the constellation. In the example of FIG. 11A, LightSource9 may be assigned as the index light source for the constellation of light sources detected at the first angular position 1102.

At 908, method 900 comprises, adjusting an intensity of one or more light sources to adjust a relative intensity of each of the one or more light sources of the constellation of light sources compared to one or more other light sources. Adjusting the intensity of the one or more light sources of the constellation may comprise adjusting the intensity such that the index light source and other light sources detected in the constellation of light sources have a substantially uniform intensity from a perspective of the image sensor. For example, while the peripheral device is at the current angular position, the imaging computing device may determine whether an intensity of the index light source for the constellation of light sources is sufficiently bright for detection, e.g. by thresholding image data to detect the constellation of light sources.

If the index light source for the constellation is not sufficiently bright or is overly bright (e.g. causes pixel saturation), the imaging computing device may send a control signal to the peripheral device to increase or decrease the intensity. Thus, method 900 may comprise adjusting an intensity of the index light source, as indicated at 910. The imaging computing device also determines intensity values for each of the other light sources detected within the constellation of light sources, and sends a control signal(s) to the peripheral device to trigger the peripheral device to adjust the intensity of each of the other light sources. In response, the peripheral device adjusts the intensity of each of the other light sources, as indicated at 912 For one or more light sources of the peripheral device that are not detected within the constellation of light sources, the control signal may trigger the peripheral device to adjust the intensity of the light source(s) to zero (power off).

At 914, method 900 comprises determining whether each light source has been indexed. If each light source has been indexed, method 900 continues to 920. If a light source has not been indexed, the method proceeds to 916.

At 916, method 900 comprises changing a position of the peripheral device such that one or more light sources of the peripheral device within a field of view of the image sensor at the first angular position are not within the field of view at a second angular position. FIG. 11B depicts the peripheral device 402 at the second angular position 1104, where light sources 5 through 11 are within view of the image sensor 1004, and light source 12 is no longer within view of the image sensor 1004. In some examples, changing a position of the peripheral device may comprise rotating the peripheral device about an axis. As shown in FIG. 10, a rotating mount 1002 may rotate the peripheral device 108. In other examples, a position change about a single axis may not achieve a suitably low viewing angle for each light source. In such examples, the imaging computing device may estimate light source intensity via a three-dimensional model of the peripheral device, and/or may utilize 3-axis motion to image each light source at a suitably low viewing angle to the image sensor.

After changing the position of the peripheral device, method 900 returns to step 902 to calibrating a constellation of light sources in view of the image sensor at the new current angular position. While the peripheral device is at the new current angular position, the same or similar processes as described above may be performed to capture image data of the peripheral device at the current angular position, detect in the image data a constellation of light sources visible at the current angular position, assign an index light source for the constellation of light sources (e.g. LightSource8 in FIG. 11B), and adjust an intensity of one or more light sources of the peripheral device. This process is continued at different angular positions of the peripheral device until all light sources of the peripheral device are indexed (e.g. until each light source is an index light source for a constellation). By adjusting the intensity of one or more light sources on a per-constellation basis, the light sources within a detected constellation of light sources may exhibit uniform brightness from a perspective of the image sensor, even though the light sources comprise different viewing angles and different manufacturing characteristics. This may facilitate light source disambiguation and optical tracking of a peripheral device.

Returning to FIG. 10, the peripheral device 108 is positioned such that light sources on an exterior of the ring-like structure 1008 are within view of the image sensor 1004. Thus, changing the position of the peripheral device, at 916, may comprise positioning the peripheral device opposite the pose shown in FIG. 10, such that light sources on an interior of the ring-like structure 1008 are within view of the image sensor 1004. Method 900 may then proceed to 918, to perform the calibration process 900 for each light source on the interior of the ring-like structure 1008. In other examples, light sources of a peripheral device may be calibrated in any other suitable order.

Once all light sources are indexed, method 900 comprises, at 920, storing a calibration table comprising, for each constellation, the intensity of the index light source and the intensity of each of the other light sources of the peripheral device within that constellation. Storing the calibration table may comprise storing the calibration table locally on the peripheral device. The calibration table also may be stored elsewhere, such as in a network-accessible storage location as a backup copy for device recovery.

As mentioned above, some light sources may be out of view of the image sensor at the first angular position (or any other angular position). The calibration table thus may store, for one or more constellation indices, an intensity of zero for one or more selected light sources of the peripheral device that are not visible to the image sensor when the constellation is viewable by an image sensor, as indicated at 922. This may help to extend battery life for a peripheral device relative to illuminating light sources that are not visible to the image sensor. Additionally or alternatively, the calibration table may store non-zero intensities for one or more neighboring light sources, as indicated at 924.

In some embodiments, the methods and processes described herein may be tied to a computing system of one or more computing devices. In particular, such methods and processes may be implemented as a computer-application program or service, an application-programming interface (API), a library, and/or other computer-program product.

FIG. 12 schematically shows a non-limiting embodiment of a computing system 1200 that can enact one or more of the methods and processes described above. Computing system 1200 is shown in simplified form. Computing system 1200 may take the form of one or more personal computers, server computers, tablet computers, home-entertainment computers, network computing devices, gaming devices, mobile computing devices, mobile communication devices (e.g., smart phone), and/or other computing devices. Computing system 1200 may represent any of NED device 102, peripheral device 108, NED device 404, peripheral device 402, and imaging computing device 1006.

Computing system 1200 includes a logic machine 1202 and a storage machine 1204. Computing system 1200 may optionally include a display subsystem 1206, input subsystem 1208, communication subsystem 1210, and/or other components not shown in FIG. 12.

Logic machine 1202 includes one or more physical devices configured to execute instructions. For example, the logic machine 1202 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine 1202 may include one or more processors configured to execute software instructions. Additionally or alternatively, the logic machine 1202 may include one or more hardware or firmware logic machines configured to execute hardware or firmware instructions. Processors of the logic machine 1202 may be single-core or multi-core, and the instructions executed thereon may be configured for sequential, parallel, and/or distributed processing. Individual components of the logic machine 1202 optionally may be distributed among two or more separate devices, which may be remotely located and/or configured for coordinated processing. Aspects of the logic machine 1202 may be virtualized and executed by remotely accessible, networked computing devices configured in a cloud-computing configuration.

Storage machine 1204 includes one or more physical devices configured to hold instructions executable by the logic machine 1202 to implement the methods and processes described herein. When such methods and processes are implemented, the state of storage machine 1204 may be transformed—e.g., to hold different data.

Storage machine 1204 may include removable and/or built-in devices. Storage machine 1204 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 1204 may include volatile, nonvolatile, dynamic, static, read/write, read-only, random-access, sequential-access, location-addressable, file-addressable, and/or content-addressable devices.

It will be appreciated that storage machine 1204 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 1202 and storage machine 1204 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 1200 implemented to perform a particular function. In some cases, a program may be instantiated via logic machine 1202 executing instructions held by storage machine 1204. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 1206 may be used to present a visual representation of data held by storage machine 1204. This visual representation may take the form of a graphical user interface (GUI). As the herein described methods and processes change the data held by the storage machine, and thus transform the state of the storage machine, the state of display subsystem 1206 may likewise be transformed to visually represent changes in the underlying data. Display subsystem 1206 may include one or more display devices utilizing virtually any type of technology. Such display devices may be combined with logic machine 1202 and/or storage machine 1204 in a shared enclosure, or such display devices may be peripheral display devices.

When included, input subsystem 1208 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1210 may be configured to communicatively couple computing system 1200 with one or more other computing devices. Communication subsystem 1210 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem 1210 may allow computing system 1200 to send and/or receive messages to and/or from other devices via a network such as the Internet.

Another example provides a near-eye display device comprising an image sensor, a communications subsystem, a logic subsystem, and a storage subsystem storing instructions executable by the logic subsystem to control a peripheral device comprising a plurality of light sources by receiving image data from the image sensor, identifying in the image data a constellation of light sources formed by a subset of light sources of the peripheral device, and based upon the constellation of light sources identified, send, to the peripheral device via the communications subsystem, constellation information related to the constellation of light sources identified. In such an example, the constellation information may additionally or alternatively comprise an index identifying a selected light source within the subset of light sources. In such an example, the constellation information may additionally or alternatively comprise a list of light sources within the subset of light sources detected. In such an example, the instructions may additionally or alternatively be executable to determine, via the image data, that the peripheral device is outside of a field of view of the image sensor, receive motion data from the peripheral device, and based upon the motion data received, determine that the peripheral device is moving towards the field of view of the image sensor, and sending the constellation information may additionally or alternatively comprise sending a control signal to the peripheral device to trigger the peripheral device to power on each light source of the plurality of light sources. In such an example, the instructions may additionally or alternatively be executable to, based at least on the image data, determine a second constellation of light sources of the peripheral device likely to be detected in a future image frame, and sending the constellation information may additionally or alternatively comprise sending, to the peripheral device, second constellation information related to the second constellation of light sources determined. In such an example, the instructions may additionally or alternatively be executable to receive motion data from a motion sensor indicating a motion of the peripheral device relative to the near-eye display device, and sending the constellation information may additionally or alternatively comprise sending to the peripheral device a prediction of a constellation likely to be detected in a future image frame based on the motion data. In such an example, the instructions may additionally or alternatively be executable to determine that the peripheral device is out of a field of view of the image sensor, and sending the constellation information may additionally or alternatively comprise sending a control signal to the peripheral device to trigger the peripheral device to power off each light source of the plurality of light sources.

Another example provides a peripheral device configured to be held or worn by a user, the peripheral device comprising a plurality of light sources, a communications subsystem configured to receive constellation information from an imaging computing device regarding a constellation of light sources of the peripheral device detected by the imaging computing device in image data, and a controller configured to, based upon the constellation information received, determine an intensity at which to illuminate each light source, and adjust the intensity of one or more light sources based on the intensities determined. In such an example, for a select light source indicated by the constellation information to be out of view, the controller may additionally or alternatively be configured to adjust an intensity of the select light source to zero. In such an example, the plurality of light sources may additionally or alternatively comprise a plurality of visible light-emitting diodes (LEDs) and/or infrared (IR) LEDs. In such an example, the constellation information may additionally or alternatively comprise an index identifying a selected light source of the constellation of light sources. In such an example, the constellation information may additionally or alternatively comprise a list of light sources detected by the imaging computing device. In such an example, the controller may additionally or alternatively be configured to determine the intensity at which to illuminate the light source via a calibration table stored on the peripheral device, the calibration table comprising an intensity value for each light source of the plurality of light sources. In such an example, the peripheral device may additionally or alternatively comprise a motion sensor, and the controller may additionally or alternatively be configured to receive motion data from the motion sensor indicating a motion of the peripheral device, and adjust a power provided to one or more light sources based on the motion data received. In such an example, the controller may additionally or alternatively be configured to, based upon the motion data received, determine one or more light sources likely to be detected by the imaging computing device in a future image frame, and increase an intensity of each of the one or more light sources determined likely to be detected in the future image frame. In such an example, the controller may additionally or alternatively be configured to, based on the motion data received, power on one or more neighboring light sources of the first constellation of light sources, each neighboring light source being proximate to a light source within the first constellation of light sources.

Another example provides a method of calibrating, via a computing system comprising an image sensor, a peripheral device having a plurality of light sources for position tracking, the method comprising capturing first image data of the peripheral device at a first position of the peripheral device, detecting, in the first image data, a first constellation of light sources visible at the first position, adjusting an intensity of each of one or more light sources of the first constellation of light sources to adjust a relative intensity of each of the one or more light sources of the first constellation of light sources compared to one or more other light sources, changing a position of the peripheral device such that one or more light sources of the peripheral device within a field of view of the image sensor at the first position are not within the field of view at a second position, capturing second image data of the peripheral device at the second position of the peripheral device, detecting, in the second image data, a second constellation of light sources visible at the second position, adjusting an intensity of each of one or more light sources of the second constellation of light sources to adjust a relative intensity of each of the one or more light sources of the second constellation of light sources compared to one or more other light sources, and storing a calibration table comprising, for each of the first constellation of light sources and the second constellation of light sources, an intensity for each light source detected. In such an example, adjusting the intensity of each of the one or more light sources of the first constellation of light sources may additionally or alternatively comprise adjusting the intensity of an index light source for the first constellation of light sources constellation, and adjusting an intensity of each of other light sources detected within the first constellation of light sources to have a substantially uniform intensity as the index light source from the perspective of the image sensor. In such an example, storing the calibration table may additionally or alternatively comprise, for the first constellation of light sources, storing an intensity of zero for each light source of the peripheral device that is not visible at the first angular position. In such an example, storing the calibration table may additionally or alternatively comprise, for the first constellation of light sources, storing information regarding one or more neighboring light sources, each neighboring light source being proximate to a light source within the first constellation of light sources.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A near-eye display device, comprising:
   an image sensor;
   a communications subsystem;
   a logic subsystem; and
   a storage subsystem storing instructions executable by the logic subsystem to control a peripheral device comprising a plurality of light sources by
      receiving image data from the image sensor;
      identifying in the image data a constellation of light sources formed by a subset of light sources of the peripheral device; and
      based upon the constellation of light sources identified, send, to the peripheral device via the communications subsystem, constellation information related to the constellation of light sources identified, the constellation information comprising an index based upon a light source having a lowest angle to the image sensor.

2. The near-eye display device of claim 1, wherein the constellation information comprises a list of light sources within the subset of light sources detected.

3. The near-eye display device of claim 1, wherein the instructions are further executable to
   determine, via the image data, that the peripheral device is outside of a field of view of the image sensor;
   receive motion data from the peripheral device; and
   based upon the motion data received, determine that the peripheral device is moving towards the field of view of the image sensor; and
   wherein sending the constellation information comprises sending a control signal to the peripheral device to trigger the peripheral device to power on each light source of the plurality of light sources.

4. The near-eye display device of claim 1, wherein the instructions are further executable to, based at least on the image data, determine a second constellation of light sources of the peripheral device likely to be detected in a future image frame, and wherein sending the constellation information comprises sending, to the peripheral device, second constellation information related to the second constellation of light sources determined.

5. The near-eye display device of claim 1, wherein the instructions are further executable to receive motion data from a motion sensor indicating a motion of the peripheral device relative to the near-eye display device, and wherein sending the constellation information comprises sending to the peripheral device a prediction of a constellation likely to be detected in a future image frame based on the motion data.

6. The near-eye display device of claim 1, wherein the instructions are further executable to determine that the peripheral device is out of a field of view of the image sensor, and wherein sending the constellation information comprises sending a control signal to the peripheral device to trigger the peripheral device to power off each light source of the plurality of light sources.

7. A peripheral device configured to be held or worn by a user, the peripheral device comprising:
   a plurality of light sources;
   a communications subsystem configured to receive constellation information from an imaging computing device regarding a constellation of light sources of the peripheral device detected by the imaging computing device in image data, the constellation information comprising an index that indexes light intensity values in a calibration table stored on the peripheral device, the index based upon a light source having a lowest angle to the imaging computing device; and
   a controller configured to, based upon the constellation information received, determine an intensity at which to illuminate each light source using the calibration table, and adjust the intensity of one or more light sources based on the intensities determined.

8. The peripheral device of claim 7, wherein for a select light source indicated by the constellation information to be out of view, the controller is configured to adjust an intensity of the select light source to zero.

9. The peripheral device of claim 7, wherein the plurality of light sources comprises a plurality of visible light-emitting diodes (LEDs) and/or infrared (IR) LEDs.

10. The peripheral device of claim 7, wherein the constellation information comprises a list of light sources detected by the imaging computing device.

11. The peripheral device of claim 7, further comprising a motion sensor, and wherein the controller is further configured to receive motion data from the motion sensor indicating a motion of the peripheral device, and adjust a power provided to one or more light sources based on the motion data received.

12. The peripheral device of claim 11, wherein the controller is further configured to, based upon the motion data received, determine one or more light sources likely to be detected by the imaging computing device in a future image frame, and increase an intensity of each of the one or more light sources determined likely to be detected in the future image frame.

13. The peripheral device of claim 11, wherein the controller is further configured to, based on the motion data received, power on one or more neighboring light sources of the first constellation of light sources, each neighboring light source being proximate to a light source within the first constellation of light sources.

14. A method of calibrating, via a computing system comprising an image sensor, a peripheral device having a plurality of light sources for position tracking, the method comprising:

capturing first image data of the peripheral device at a first position of the peripheral device;

detecting, in the first image data, a first constellation of light sources visible at the first position;

adjusting an intensity of each of one or more light sources of the first constellation of light sources to adjust a relative intensity of each of the one or more light sources of the first constellation of light sources compared to one or more other light sources;

changing a position of the peripheral device such that one or more light sources of the peripheral device within a field of view of the image sensor at the first position are not within the field of view at a second position;

capturing second image data of the peripheral device at the second position of the peripheral device;

detecting, in the second image data, a second constellation of light sources visible at the second position;

adjusting an intensity of each of one or more light sources of the second constellation of light sources to adjust a relative intensity of each of the one or more light sources of the second constellation of light sources compared to one or more other light sources; and storing a calibration table comprising, for each of the first constellation of light sources and the second constellation of light sources, an intensity for each light source detected.

15. The method of claim 14, wherein adjusting the intensity of each of the one or more light sources of the first constellation of light sources comprises adjusting the intensity of an index light source for the first constellation of light sources constellation, and adjusting an intensity of each of other light sources detected within the first constellation of light sources to have a substantially uniform intensity as the index light source from the perspective of the image sensor.

16. The method of claim 14, wherein storing the calibration table further comprises, for the first constellation of light sources, storing an intensity of zero for each light source of the peripheral device that is not visible at the first position.

17. The method of claim 14, wherein storing the calibration table further comprises, for the first constellation of light sources, storing information regarding one or more neighboring light sources, each neighboring light source being proximate to a light source within the first constellation of light sources.

* * * * *